(12) United States Patent
Lee

(10) Patent No.: US 8,658,583 B2
(45) Date of Patent: Feb. 25, 2014

(54) METHOD FOR MAKING A PHOTORESIST STRIPPING SOLUTION COMPRISING AN ORGANIC SULFONIC ACID AND AN ORGANIC HYDROCARBON SOLVENT

(75) Inventor: Wai Mun Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 816 days.

(21) Appl. No.: 12/564,584

(22) Filed: Sep. 22, 2009

(65) Prior Publication Data

US 2010/0279910 A1 Nov. 4, 2010

Related U.S. Application Data

(60) Provisional application No. 61/098,963, filed on Sep. 22, 2008.

(51) Int. Cl.
*C11D 1/14* (2006.01)
(52) U.S. Cl.
USPC ............................ 510/175; 510/176; 510/407
(58) Field of Classification Search
USPC .......................................... 510/175, 176, 407
See application file for complete search history.

(56) References Cited

U.S. PATENT DOCUMENTS

| | | | | |
|---|---|---|---|---|
| 3,927,081 A | * | 12/1975 | Thomas et al. | 562/96 |
| 4,165,294 A | | 8/1979 | Vander Mey | |
| 4,215,005 A | | 7/1980 | Vander Mey | |
| 4,221,674 A | | 9/1980 | Vander Mey | |
| 4,321,214 A | * | 3/1982 | Nicolet | 562/96 |
| 4,321,215 A | * | 3/1982 | McAbery | 562/33 |
| 4,395,348 A | | 7/1983 | Lee | |
| 4,491,530 A | | 1/1985 | Thomas | |
| 4,844,832 A | | 7/1989 | Kobayashi et al. | |
| 4,992,108 A | | 2/1991 | Ward et al. | |
| 5,728,664 A | | 3/1998 | Michelotti | |
| 6,475,292 B1 | | 11/2002 | Sahbari | |
| 6,660,460 B2 | | 12/2003 | Sahbari | |
| 2003/0030030 A1 | * | 2/2003 | Sahbari | 252/79.1 |
| 2006/0043070 A1 | * | 3/2006 | Moore | 216/83 |
| 2007/0272275 A1 | * | 11/2007 | Wu et al. | 134/19 |

OTHER PUBLICATIONS

Gregory P. Dado, et al., Sulfonation and Sulfation, in Kirk-Othmer Encyclopedia of Chemical Technology, vol. 23, (May 2006).

* cited by examiner

*Primary Examiner* — Gregory E Webb
(74) *Attorney, Agent, or Firm* — Dunlap Codding, P.C.

(57) ABSTRACT

An improved method for making a photoresist stripping solution for a metal-containing semi-conductor substrate where the stripping solution comprises a blend of at least one organic sulfonic acid with a halogen-free hydrocarbon solvent wherein concentrations of trace amounts of residual sulfuric acid and sulfur trioxide in the blend are reduced to very low levels.

17 Claims, 3 Drawing Sheets

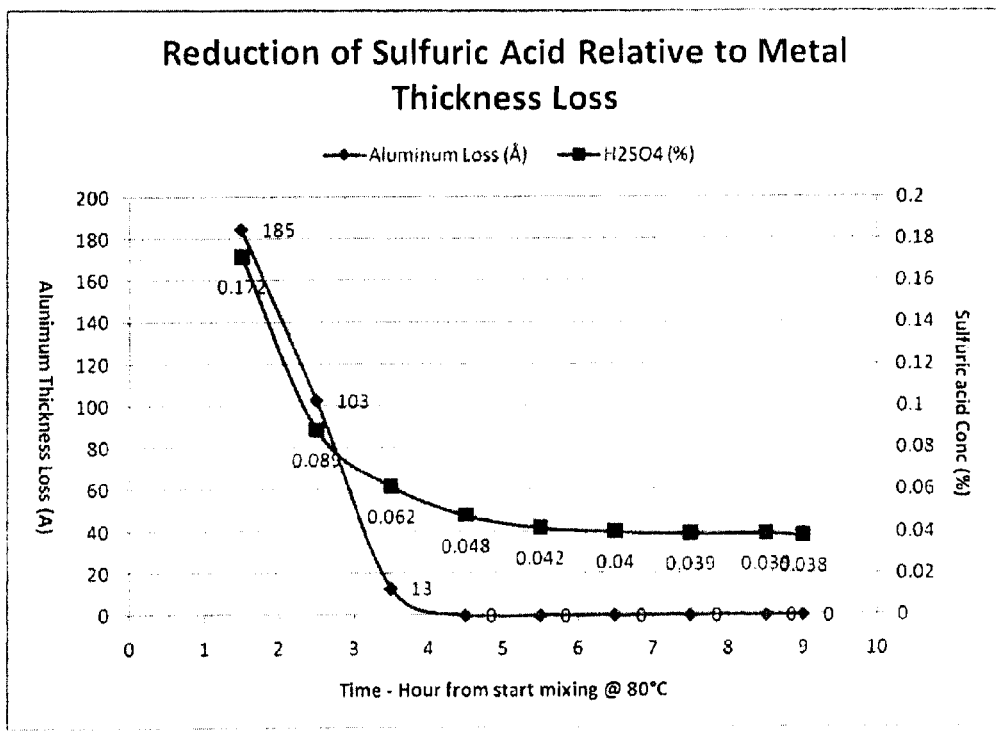
Fig. 1. Metal Loss test is conducting at 90°C for 30 minutes and sulfuric acid concentration is determined using Ion Chromatograph Method

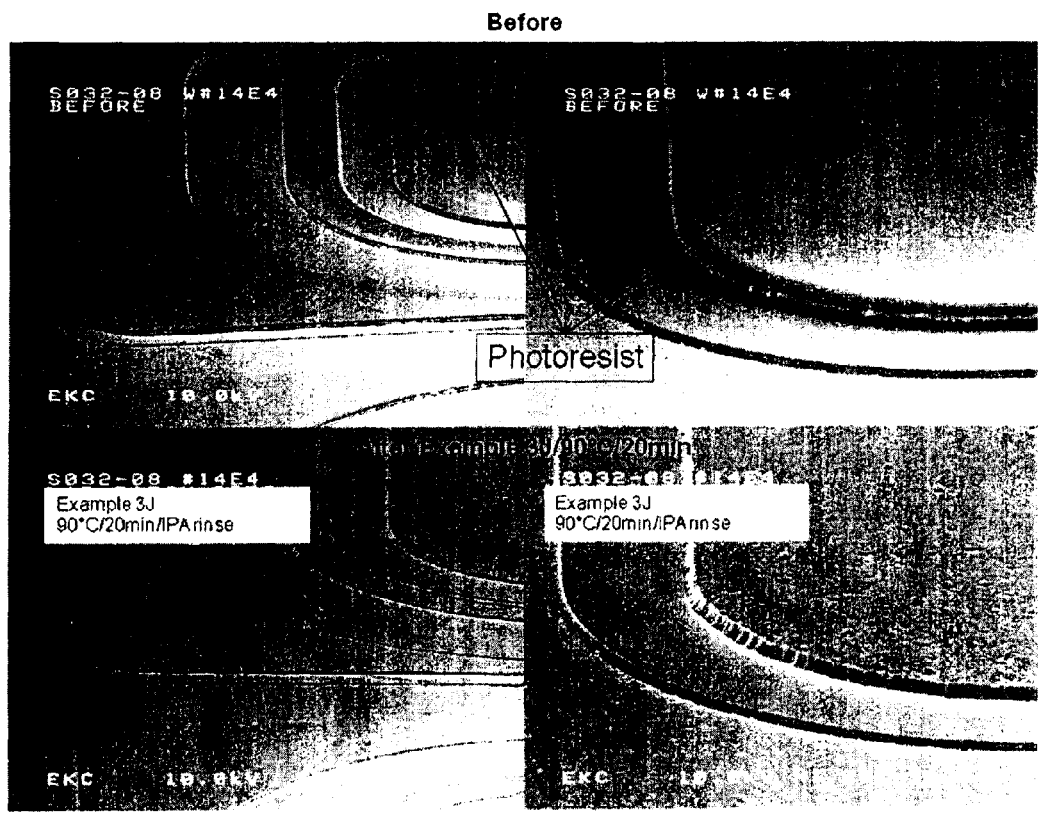
Fig. 2. Stripping Effective of Sample 3J
Photoresist is completely removed without damaging the metal surface.

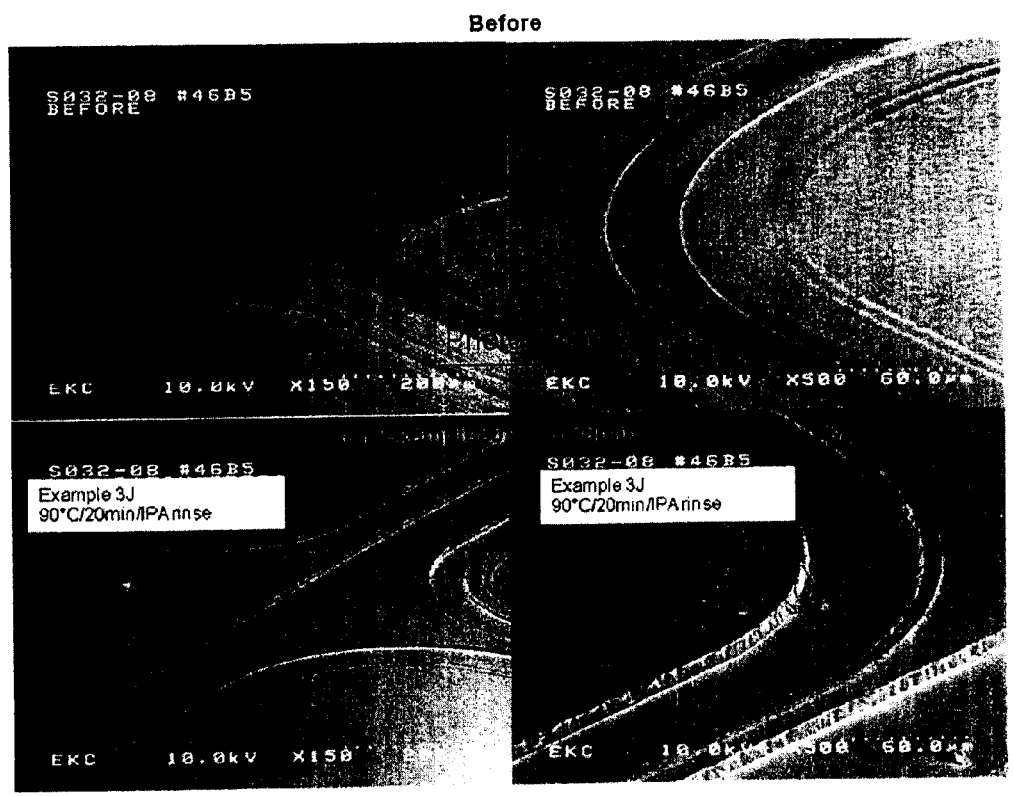
Fig. 3. Stripping Effective of Sample 3J
Photoresist is completely removed without damaging the metal surface.

METHOD FOR MAKING A PHOTORESIST STRIPPING SOLUTION COMPRISING AN ORGANIC SULFONIC ACID AND AN ORGANIC HYDROCARBON SOLVENT

CROSS REFERENCE TO RELATED APPLICATIONS

This application claims the benefit under 35 U.S.C. 119(e) of U.S. Provisional Application Ser. No. 61/098,963, filed Sep. 22, 2008, the contents of which are hereby expressly incorporated by reference herein in its entirety.

BACKGROUND OF THE INVENTION

The present invention relates to an improvement in a method for making a photoresist stripping solution, and, more particularly, to a method for making a photoresist solution comprising a blend of at least one organic sulfonic acid wherein concentrations of trace amounts of residual sulfuric acid and sulfur trioxide in the blend are reduced to very low levels.

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the substrate, e.g. silicon, $SiO_2$ or aluminum while such etchant selectively removes the substrate materials from the unprotected area of the substrate. Following completion of the etching operation and washing away of the residual etchant, it is necessary that the resist be removed from the protective surface to permit essential finishing operations. It is necessary in a photolithographic process that the photoresist material, following pattern delineation, be evenly and completely removed from all unexposed areas, in the case of positive resists, or exposed areas in the case of negative resists, so as to permit further lithographic operations. Even the partial remains of a resist in an area to be further patterned are undesirable. Also, undesired resist residues between patterned lines can have deleterious effects on subsequent processes, such as metallization, or cause undesirable surface states and charges.

A common method used in removing the photoresist from the substrate is by contacting the substrates with an organic stripper. Heretofore these organic strippers have been composed of various components whose purpose it was to lift and remove the polymeric photoresist from the substrate. However, these stripping solutions have heretofore usually contained chlorinated hydrocarbon compounds which resulted in a distinct disadvantage due to the toxicity as well as pollution problems arising from their disposal.

It is also highly desirable that stripping compositions be provided that are effective and efficient for removal of photoresist coatings from the substrate without attacking the underlying metal surfaces.

It is also desirable that effective stripping compositions be provided that are devoid of undesirable chlorinated solvents considered to be undesirable by regulatory agencies overseeing their production and use.

It is known that mixtures of aromatic solvents with an alkylarylsulfonic acids having 6-20 carbons effectively removing positive and negative tone photoresists, bonding adhesive, ink mark and post etch residue etc., are being used in semiconductor manufacturing. However, such mixtures can cause corrosion of metal surface substrates, such as aluminum and copper, which are being used as conductive wiring for the integrated devices. Compositions have been developed by adding corrosion inhibitors to reduce the effect of metal corrosion, such as described in the following references:

U.S. Pat. No. 4,215,005—discloses the use of hydrogen fluoride complexes to reduce aluminum corrosion during stripping to improve over stripping solutions cited in U.S. Pat. No. 4,165,294.

U.S. Pat. No. 4,221,674—discloses the use of inhibitors system containing hydrogen fluoride and nitrile compound to enhance corrosion inhibition properties of the fluoride to further improve over stripping solutions cited in U.S. Pat. No. 4,215,005.

U.S. Pat. No. 4,395,348—discloses the use of catechol as corrosion inhibitor by heating the solution to 60° C. to dissolve the catechol into the solution prior using it for photoresist stripping.

U.S. Pat. No. 4,491,530—discloses the use of water soluble sulfone to suppress the "brown staining" which is a form of metal corrosion on aluminum metal surface [Col 5, lines 19-30].

U.S. Pat. No. 4,844,832—discloses the use of phenolic compounds in the stripping solution to achieve the stripping performance.

U.S. Pat. No. 5,728,664—discloses the use of alkyl phenol as corrosion inhibitor to improve stripper solutions cited in U.S. Pat. No. 4,992,108.

U.S. Pat. Nos. 6,475,292 and 6,660,460—discloses use of catechol as the preferred corrosion inhibitor.

Kirk-Othmer Encyclopedia of Chemical Technology: Wiley InterScience, Vol 23, describes details of the sulfonation process for aromatic hydrocarbon. Aromatic hydrocarbons are generally directly sulfonated using sulfur trioxide, oleum, or sulfuric acid. The main cause of the attack comes from residual amounts of sulfuric acid and sulfur trioxide that are present in the sulfonic acid from the manufacturing.

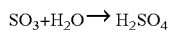

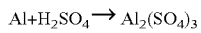

By mixing the sulfonic acid with a hydrocarbon solvent at an elevated temperature for an extended period of time, residual amounts of sulfuric acid and sulfur trioxide react with the hydrocarbon solvent to form a corresponding organic sulfonic acids and the amounts of each undesirable component are thereby reduced to an acceptable and very low level that effectively eliminates the attack on aluminum.

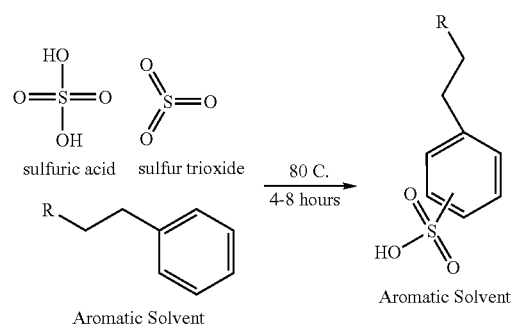

It is an object of the invention to provide an improved method of manufacturing of photoresist stripping compositions comprising one or more organic sulfonic acids and one or more hydrocarbon solvents which can be used at a wide range of operating conditions and at lower temperatures without corrosion of the semiconductor substrate. The improvement comprises blending the one or more organic sulfonic acids with the one or more hydrocarbon solvents at elevated temperature for a period of time sufficient for the residual amounts of sulfuric acid and sulfur trioxide to react with the one or more hydrocarbon solvents to form corresponding organic sulfonic acids.

It is another object of this invention to provide a photoresist stripping solution comprising an organic sulfonic acid and a hydrocarbon solvent which is essentially free of chlorinated hydrocarbon compounds and which can be used at a wide range of operating conditions and at lower temperatures without corrosion of the semiconductor substrate.

The material to be stripped is typically contacted with the present compositions for a period of time sufficient to at least partially remove the material, preferably for a period of time to substantially remove the material, and more preferably for a period of time to completely remove the material. The contact time of the present compositions with the material to be stripped will vary, depending upon the exact stripper composition as well as the material to be stripped.

For example, the material to be removed may be contacted with the present compositions for up to about 60 minutes, preferably from about 5 seconds to about 45 minutes, and more preferably from about 15 seconds to about 35 minutes. In removing material, the compositions of the present invention may be used at room temperature or may be heated. Such heating has the advantage of shortening the time required for complete removal of the material. Typically, the compositions of the present invention are heated at a temperature of about 30° C. to about 120° C., and preferably about 40° C. to about 95° C. It is preferred that the compositions of the present invention are heated.

SUMMARY OF THE INVENTION

The present invention is an improved method for manufacturing photoresist stripping compositions, i.e., solutions, for semiconductor substrates comprising a uniform blend of one or more organic sulfonic acids and one or more halogen-free hydrocarbon solvents which can be used at a wide range of operating conditions and at lower temperatures without corrosion of the semiconductor substrate. The improvement comprises blending the one or more organic sulfonic acids with the one or more halogen-free hydrocarbon solvents at elevated temperature and for a period of time sufficient for residual amounts of sulfuric acid and sulfur trioxide present in the organic sulfonic acid to react with the one or more hydrocarbon solvents to form corresponding non-corrosive organic sulfonic acids.

The preferred mixing temperature range is from 45° C. to 260° C. and for a time period that sufficiently reduces any trace amounts of residual sulfuric acid and/or sulfur trioxide present in the organic sulfonic acid to a level which will not cause damage, i.e., corrosion, to the metal film in the substrates.

Optionally, the photoresist stripper further comprises other surfactants.

Optionally, the photoresist stripper further comprises other solvents.

Optionally, the photoresist stripper further comprises one or more corrosion inhibitors or chelating agents.

The invention also relates to a method for removing photoresist coatings from a substrate utilizing the composition of the invention.

BRIEF DESCRIPTION OF THE DRAWINGS

FIG. 1 is a graph which compares metal loss to reduction in sulfuric acid concentration for various sample blends.

FIGS. 2 and 3 demonstrate stripping effect resulting from Sample 3J.

DETAILED DESCRIPTION OF THE INVENTION

Organic Sulfonic Acid

A wide variety of sulfonic acid compounds may be use in the present invention. There are varieties of sulfonation reagents available, which make possible the conversion of a wide range of aromatics into sulfonic acids. The general mechanism for the reaction of an aromatic compound with sulfur trioxide involves an activated intermediate as shown in Equation (1).

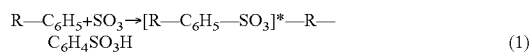

$$R\text{—}C_6H_5+SO_3 \rightarrow [R\text{—}C_6H_5\text{—}SO_3]^*\text{—}R\text{—}C_6H_4SO_3H \qquad (1)$$

The sulfonic acids may be alkyl, aryl or alkylaryl. It is preferred that the groups of sulfonic acids are surfactants. It is further preferred that the sulfonic acids are aromatic.

Suitable sulfonic acids include, but are not limited to, benzene sulfonic acid, ($C_1$-$C_{20}$) alkylbenzene sulfonic acid, naphthalene sulfonic acid, ($C_1$-$C_{20}$) alkylnaphthalene sulfonic acid, ($C_7$-$C_{10}$) alkylaryl sulfonic acid, and the like. Preferred sulfonic acids include benzene sulfonic acid, tolyl sulfonic acid, hexylbenzene sulfonic acid, heptylbenzene sulfonic acid, octylbenzene sulfonic acid, decylbenzene sulfonic acid, dodecylbenzene sulfonic acid, tridecylbenzene sulfonic acid, quadecylbenzene sulfonic acid, hexadecylbenzene sulfonic acid, and benzyl sulfonic acid. It is further preferred that the sulfonic acid compound is one or more ($C_{12}$-$C_{20}$) alkylbenzene sulfonic acids. Mixtures of sulfonic acid compounds may be advantageously used in the present invention. The sulfonic acid compounds are generally commercially available from a variety of sources, such as Pilot Chemical and Aldrich Chemical, and they may be used without further purification. Typically, the sulfonic acid compounds are used in the present compositions in an amount of from about 1% to about 90% wt, based on the total weight of the composition. It is preferred that the sulfonic acid compounds are used in an amount of from about 15% to about 65% wt, and more preferably from about 20% to about 50% wt.

Hydrocarbon Solvent

The solvent or solvent systems which are to be used must be materials which do not deter from the stripping effectiveness of the sulfonic acid and should be miscible with the one or more sulfonic acids. The solvent is also present to reduce the viscosity and to render the sulfonic acid more readily removed from the substrate during rinsing with water.

The preferred hydrocarbon solvents employed generally contain at least 8 carbon atoms and have boiling points starting at about 135° C.

Such hydrocarbon solvents are available from refined petroleum product companies, such as, for example, Shell Chemical Co., Exxon Mobil, and BP.

For example, hydrocarbon solvents available from Shell Chemical Co. include, but are not limited to, the following:

ShellSol D38 is a narrow cut mineral spirit type hydrocarbon solvent manufactured to combine an improved flash point level with fast drying characteristics. The high degree of general refining gives this solvent its low level of impurities such as sulphur, olefins, benzene and total aromatics, and low odor ShellSol D40 is derived from Low Aromatic White Spirit which has been highly refined and reacted with hydrogen to convert aromatics to cycloparaffins. This deep hydrogenation results in products of controlled composition with very low aromatic contents, negligible reactive impurities and a low, sweet odor. ShellSol D40 consists predominantly of $C_9$-$C_{11}$ paraffins and naphthenics ShellSol D43 is a wider cut, mineral spirit type hydrocarbon solvent with slightly increased heavy end content. The high degree of general refining gives this solvent its low level of impurities such as sulphur, olefins, benzene and total aromatics, and low odor ShellSol D60 is derived from selected petroleum feedstocks which have been highly refined and reacted with hydrogen to convert aromatics to cycloparaffins. This deep hydrogenation results in products of controlled composition with very low aromatic contents, negligible reactive impurities and a low, sweet odour. ShellSol D60 consists predominantly of $C_{10}$-$C_{12}$ paraffins and naphthenics ShellSol D80 is a low viscosity, colourless solvent with a low aromatics content and a mild odor ShellSol X7B is a mixture of Toluene, Xylene and an aliphatic hydrocarbon solvent to meet the requirements of a medium aromatic solvent. It has a good solvent power and is fast evaporating ShellSol A100 Solvent is a mixture of predominantly $C_9$ hydrocarbons with >99% aromatic, which confers good solvency [Mixed Aniline Point<60 and KB >88]. The Hazardous Air Pollutants content is low, and it has very low sulfur content ShellSol A150 is a mixture of $C_9$-$C_{11}$ hydrocarbons with >99% aromatic content which confers good solvency. The Hazardous Air Pollutants content is low, and it has very low sulfur content. This high boiling solvent is slow evaporating and has a high flash point ShellSol A150 ND is a narrow cut hydrocarbon solvent with a flash point >61° C. and consists essentially of a mixture of aromatic components. This solvent is particularly suited for those applications where a low naphthalene content is required. With a flash point >61° C., for transport ShellSol A150 ND generally is classified as combustible rather than as flammable liquid Aromatic solvents available from ExxonMobil include, but are not limited to, the following:

Solvesso™ 150, has an initial boiling point of about 186° C. and a dry point of about 204° C.

Exxon Aromatic 100, has initial boiling point of about 161° C. and a dry point of about 171° C.

Exxon Aromatic 150, has initial boiling point of about 186° C. and a dry point of about 204° C.

Exxon (Naphthalene Depleted) Aromatic 150 ND, has initial boiling point of about 188° C. and a dry point of about 200° C.

Exxon Aromatic 200, has initial boiling point of about 232° C. and a dry point of about 278° C.

Exxon Naphthalene Depleted Aromatic 200, has initial boiling point of about 238° C. and a dry point of about 275° C.

Preferred aromatic solvents of the present invention have initial boiling points of about 120° C. at 760 mm Hg pressure, and a dry point of about 170° C. to about 280° C.

A preferred composition of the present invention contains about 30% of dodecylbenzene sulfonic acid and about 70% by weight of the aromatic hydrocarbon containing at least 8 carbon atoms and preferably, Shell Sol 150, Shell Sol 150ND, Solvesso™ 150, Exxon Aromatic 150, and the like.

The composition of this invention is suitable for use with practically all of the commonly employed positive and negative photoresists used in the semiconductor industry, including, but not limited to, Kodak 747 and 752 negative photoresist; Hunt Chemical Waycoat Photoresist, both their positive HPR photoresist and their negative HNR 999 photoresist; Merck Chemical Selectilux photoresist, MacDermid negative photoresist; Shipley AZ series positive photoresist; KTI positive and negative photoresist; Dyna-Chem Thiokol OMR and OPR photoresist; and the like. The photoresists removed by the strippers of the present invention are preferably negative photoresists and most preferably the cyclicized rubber compositions such as cyclicized polyisoprene. Examples of such photoresist materials include Kodak KTFR® and Waycoat SC-100®.

The compositions of the present invention are preferably employed at temperatures of about 85° C. to about 100° C.

The compositions of the present invention may further include one or more additional corrosion inhibitors, other organic solvents, surfactants, and the like.

Corrosion Inhibitors

Suitable corrosion inhibitors useful in the present invention include, but are not limited to, catechol; ($C_1$-$C_6$) alkylcatechol such as methylcatechol, ethylcatechol and tert-butylcatechol; benzotriazole; ($C_1$-$C_{10}$) alkylbenzotriazoles; gallic acid; gallic acid esters such as methyl gallate and propyl gallate; and the like. It is preferred that the corrosion inhibitor is catechol, ($C_1$-$C_6$)alkylcatechol, benzotriazole or ($C_1$-$C_{10}$) alkylbenzotriazoles. When such corrosion inhibitors are used they are typically present in an amount in the range of about 0.01 to 10% wt, based on the total weight of the stripping composition.

Suitable Solvents

Suitable nonpolar, organic solvents for use in the composition and method of this invention include aromatic hydrocarbons containing from 6 to 14 carbon atoms, such as benzene, and the like; aliphatic hydrocarbons containing one to 30 carbon atoms, such as n-pentane, n-octane, dodecane, and the like; monoalkyl-substituted aromatic hydrocarbons, such as toluene, ethyl benzene, cumene, octylbenzene, decylbenzene and dodecylbenzene; dialkyl substituted hydrocarbons containing eight to 20 carbon atoms, such as the ortho, meta and para isomers of xylene and diethylbenzene; trialkyl-substituted aromatic hydrocarbons containing 9 to 20 carbon atoms, such as the 1,2,3-; 1,2,4- and 1,3,5-isomers of 10 trimethyl and triethylbenzene. The preferred nonpolar, organic solvents are xylene, toluene, isopropylnapthalene, and decalin.

Suitable polar organic solvents include aliphatic ketones containing 3 to 10 carbon atoms, such as acetone, methylethylketone and methylisobutylketone; monoalkyl ethers of ethylene glycol containing 3 to 10 carbon atoms, such as ethoxyethanol and butoxyethanol; carboxylic acids containing one to 4 carbon atoms, such as acetic and maleic acid; formamide; N,N-dialkylalkanonylamides containing 3 to 10 carbon atoms, such as dimethylformamide and dimethylacetamide; N-alkyl lactams containing 6 to 12 carbon atoms, such as N-methylpyrrolidone; cyclic aliphatic sulfones containing 4 to 6 carbon atoms, such as tetramethylenesulfone; and the like. The preferred polar solvents are dimethyl-formamide, N-methylpyrollidone, and sulfolane. If present, the solvent desirably comprises from about one to about 60 weight percent of the composition.

Suitable Surfactants

Suitable surfactants are selected from nonionic types, cationic types and anionic types of surfactants and include poly(vinyl alcohol), poly(ethyleneimine) and any of the surfactant compositions classified as anionic, cationic, nonionic, amphoteric, and silicone-based. Preferred surfactants are poly(vinyl alcohol), poly(ethyleneimine) and epoxy-polyamide compound. Preferably, a surfactant is present in the cleaning composition of the present invention, typically in the amount of about 10 ppm to 5% by weight based on the total weight of the cleaning composition.

Most commercially available sulfonic acids contain a residual amount of sulfuric acid and sulfur trioxide from its corresponding sulfonation reaction of sulfur trioxide with the representative organic compound.

Pilot Chemical produces dodecylbenzene sulfonic acid for use in detergents. In section 2 of the Material Safety Data Sheet (MSDS), the amounts of sulfuric acid and sulfur trioxide present in the product are listed.

| 2. COMPOSITION/INFORMATION ON INGREDIENTS | | | |
|---|---|---|---|
| Component | CAS-No | Weight % | OSHA PEL |
| Benzenesulfonic acid, C10-16-alkyl derivatives | 68584-22-5 | 97 | — |
| Benzene, C10-16-alkyl derivatives | 68648-87-3 | 1 | — |
| Sulfuric acid | 7664-93-9 | 1 | TWA: 1 mg/m3 |
| Sulfur dioxide | 7446-09-5 | 1 | TWA: 2 ppm TWA: 5 mg/m3 STEL: 15 mg/m3 STEL: 5 ppm |

When the sulfonic acid is formulated with other solvents for use in photoresist stripping and cleaning processes during the manufacturing of semiconductor devices, the presence of minute, i.e., trace, amounts of the sulfuric acid and/or sulfur trioxide will cause damage to the metal substrate surface. For example, the dodecylbenzenesulfonic acid product specification from Pilot Chemical shows the product to contain 1.0% sulfuric and 1.0% sulfur trioxide. Mixing dodecylbenzene sulfonic acid with a solvent system of the prior art, without allowing sufficient time to reduce the sulfuric acid in the stripper solution, will cause higher attack of an aluminum metal substrate.

Metal Thickness Measurement

Aluminum blanket wafers used in this study were purchased from Silicon Valley Microelectronics. An aluminum film was prepared on Si wafers by a sputtering process with a thickness of about 3000 Å. The aluminum film thickness was determined by four-point probe measurement (FOUR DIMENSIONS, Mode1280) of the change in sheet resistance of blanket samples before and after treatment in each composition. Aluminum film thickness loss at various compositions were evaluated at 90° C., for times of 20 minutes and was calculated from thickness before and after using the change in sheet resistance of the metal film.

The following examples represent preferred forms and best modes contemplated by the inventor for practicing this invention, as well as illustrating the results obtained through its use.

Example 1

This example represents a current manufacturing process for a photoresist stripper solution comprising a uniform blend of 35% of LAS-99 Dodecylbenzene sulfonic acid from Pilot Chemical, 60% of Shell Sol 150 aromatic solvent from Shell Chemical and 5% of Catechol from UBE Industries.

Into a jacketed water heating/cooling blending tank, 2400 Lbs of Shell Sol was introduced to the tank at ambient temperature. After all the solvent had been added, 1400 Lbs of Dodecylbenzene sulfonic acid was gradually added to the aromatic solvent while the mixture was being heated with 85° C. hot water re-circulated in the heating jacket. Initial sample #1A was taken 10 minutes after the solution had reached 80° C. Subsequent samples were taken at 30 minutes sample #1B and 60 minutes sample #1C, just prior the addition of catechol to the mixture. Heating was stopped after 60 minutes when the solution reached 80° C. while 200 Lbs of catechol was being introduced to the blend. A final sample #1D was taken after all the catechol had been added and the solution, i.e., blend, was cooled down with cold water to 45° C.

Four samples were analyzed for sulfuric acid content using IC method.

TABLE 1A

| Sample name | $H_2SO4$ (%) |
|---|---|
| 1A (no catechol) | 0.160 |
| 1B (no catechol) | 0.087 |
| 1C (no catechol) | 0.047 |
| 1D (with catechol) | 0.021 |

The results in Table 1A show a decrease in sulfuric acid concentration with longer heating time.

The samples taken just prior to the addition of catechol, and after catechol had been added, were tested for aluminum attack. Cleaning processing was carried out at 90° C. for 20 minutes, followed by 5 minutes' rinse in IPA and finally rinsed in deionized water. Table 1B below shows that catechol inhibits metal attack even with a residual sulfuric acid concentration of 0.021%.

TABLE 1B

| Sample name | H2SO4 (%) | Aluminum Loss | | Comment |
|---|---|---|---|---|
| 1C (no catechol) | 0.047 | 56 Å | Aluminum etched | The results showed that catechol inhibits |
| 1D (with catechol) | 0.021 | 0 Å | No change | metal attack even with a residual sulfuric acid content of 0.021% |

Separately, catechol was added to Sample #1C (no catechol) at 1%, 2%, 3%, 4% and 5% levels. The mixture of sample #1C with 5% catechol was equivalent to sample #1D. The samples were further tested for metal compatibility.

TABLE 1C

| Sample Name | 1C | 1E | 1F | 1G | 1H | 1I | 1D |
|---|---|---|---|---|---|---|---|
| Sample #3 | 100% | 99% | 98% | 97% | 96% | 95% | 95% |
| Catechol | 0 | 1% | 2% | 3% | 4% | 5% | 5% |
| Aluminum Thickness Change (Å) | 56 | 0 | 0 | 0 | 0 | 0 | 0 |
| Comments | Attack | No change | No change | No change | No change | No change | No change |

The results shown in Table 1C indicate that aluminum corrosion can be stopped by adding 1% catechol as a corrosion inhibitor.

Example 2

This Example was to confirm that a longer heating time at elevated temperature will result in a blend that demonstrates no attack to the metal film.

A mixture of 65% aromatic solvent and 35% dodecylbenzene sulfonic acid was heated in a round bottom flask equipped with stirrer, condenser, temperature probe and nitrogen inlet. The solution was mixed together and heated to 80° C. Samples were taken after two and eight hours of mixing. Cleaning processing was carried out at 90° C. for 20 minutes, followed by 5 minutes' rinse in IPA and finally rinsed in deionized water.

TABLE 2

|  | Laboratory sample was taken after 2 hours mixing @ 80° C. 2A | Laboratory sample was taken after 8 hours mixing @ 80° C. 2B |
|---|---|---|
| Aromatic/DDBSA (65/35) | 100 | 100 |
| Al Thickness Change | 22 Å | 0 |
| Comments | Attack | No Change |

The result shows that with longer mixing time at 80° C. use of the blend resulted in no aluminum attack.

Example 3

This Example was carried out to further delineate the correlation between metal corrosion and amount of residual sulfuric acid concentration in the blend. It is not necessary to reduce the sulfuric acid concentration to zero, but it is required to reach an optimum level such that it will not cause damage to the metal film.

A solution, i.e., blend, of 35% dodecylbenzene sulfonic acid from Pilot Chemical was mixed with 65% ShellSol 150A. Samples were taken using the following procedures
Sampling Procedures:
1. After adding both aromatic/DDBSA mixing at room temperature for 30 minutes—a 200 ml sample was taken for immediate sulfuric acid tests.
2. Begin heating the blend after taking the first sample.
3. A second sample was taken after the blend reached 80° C., and the sample was tested immediately for aluminum etch and sulfuric acid concentration.
4. Additional samples were taken every hour for next 8 hours and tested immediately for aluminum etch and sulfuric acid concentration.
5. Turn off heat and remove hot water—let the blend cool down to room temperature.
6. Test final blend for etch rates next day after cool down.
The samples are designated as follows:

|  | 3A | 3B | 3C | 3D | 3E | 3F | 3G | 3H | 3I | 3J* |
|---|---|---|---|---|---|---|---|---|---|---|
| Temperature ° C. | 23 | 80 | 80 | 80 | 80 | 80 | 80 | 80 | 80 | 35 |
| Time from starting mixing (minutes) | 30 | 150 | 210 | 270 | 330 | 390 | 450 | 510 | 570 | 600 |

Example 3A

The initial sample was placed in a beaker and heated to 90° C. with agitation. A wafer sputter coated with aluminum film was immersed in the solution at 90° C. for 20 minutes and rinsed in isopropyl alcohol follow by water. The metal film thickness was measured before and after the process to determine the amount of thickness loss. Sulfuric acid decreased during heating of the solution from room temperature to 90° C.

Table 3A shows the test results from the initial sample 3A.

TABLE 3A

|  | Thickness Loss | Sulfuric Acid |
|---|---|---|
| Initial Sample | 561 Å* | 0.441% |

The results indicate that the mixture is highly corrosive to the metal film surface. Sulfuric acid concentration was analyzed using IC method. The sample was shown to have 0.441% sulfuric acid by Ion Chromatograph Analysis. The theoretical amount of sulfuric acid from calculation is about 0.42% based on 1.2% sulfuric acid in the dodecylbenzene sulfonic acid obtained from Pilot Chemical Co.

Example 3B

Samples were taken every hour after the initial sample 3A. Metal compatibility tests and sulfuric acid concentration were carried out for each sample 3B to 3J.

Table 3B shown below summarizes the test results after mixing for an extended period of time at 80° C.

The results show that metal loss decreases as the sulfuric acid concentration decreases. In this experiment, there is no metal loss after 4 hours of mixing at 80° C. with a sulfuric acid concentration at 0.048%.

TABLE 3B

|  |  | 3B | 3C | 3D | 3E | 3F | 3G | 3H | 3I | 3J* |
|---|---|---|---|---|---|---|---|---|---|---|
| Metal Compatibility Test | Aluminum Loss (Å) | 185 | 103 | 13 | 0 | 0 | 0 | 0 | 0 | 0 |
|  | Comment | Attack | Attack | Less attack | No | No | No | No | No | No |
| QC Assays | $H_2SO_4$ (%) | 0.172 | 0.089 | 0.062 | 0.048 | 0.042 | 0.040 | 0.039 | 0.039 | 0.038 |

*Sample 3J is the same as sample 3I, except it has been cooled overnight

Stripping Performance Test:

The final sample after 8 hours of mixing at 80° C. from Example 3J was evaluated for photoresist stripping performance.

Example 3C

The wafers evaluated contained either hard baked negative photoresist, available under the trade names of SC-100, SC-180, and SC-450 photoresist, available from Japan Synthetic Rubber, or a positive photoresist, sold under the trade name AZP-4110, available from Clariant. Wafers containing negative photoresist were prepared by coating wafers with negative resist, soft baked at 145° C. for 30 minutes and hard baked at 150° C. for 90 minutes. The wafers were developed with mixtures of xylene and VMP (naphtha) solvent followed by rinsing with n-butyl acetate, and then the residual photoresist was removed by treating the wafers. Results are reported in Table 3C.

TABLE 3C

| Photoresist | Time/Temp | Remark |
|---|---|---|
| SC100 | 5 min/85° C. | 100% clean |
| SC180 | 10 min/90° C. | 100% clean |
| SC450 | 30 min/90° C. | 100% clean |
| AZP4110 | 10 min/85° C. | 100% clean |

FIGS. 2 and 3 demonstrate the stripping Effective of Sample 3J. Photoresist is completely removed without damaging the metal surface.

The above data demonstrate that compositions, i.e., blends, prepared according to the invention are effective at removing cross-linked positive and negative photoresist, particularly negative photoresist, from a substrate without attacking the aluminum film.

Example 3D

Novolak positive photoresist, obtained from KTI Chemical and Shipley, was exposed, developed and cured in accordance with the instructions of its supplier in a test pattern on aluminized silicon wafers, and was then stripped by immersing the wafers in the above solution of Example 3J for 20 minutes at 90° C. The photoresist was stripped clean, the stripper was water rinsed from the wafers and no residue was observed.

Example 3E

The stripping composition of Example 3J was utilized to remove isoprene negative photoresist, obtained from KTI Chemical and Kodak, exposed, developed and cured in accordance with instructions of its supplier in patterns on aluminized silicon wafers. The wafers were immersed in the stripping composition for one minute at 100° C. The composition J striped the negative photoresist from the wafers. The stripping composition was water rinsed and no visible residue was observed on the wafers.

Example 3F

The stripping composition of Example 3J was utilized to remove 8 µm thick AZ5nXT negative photoresist, obtained from Shipley, exposed, developed and cured in accordance with instructions of its supplier in patterns on silicon wafers. The wafers were immersed in the stripping composition for three minute at 90° C. The composition removed the negative photoresist from the wafers. The stripping composition was water rinsed and no visible residue was observed on the wafers.

The results show that the photoresist stripper composition produced by the invention is suitable for use under production conditions encountered in the manufacture of integrated circuits without damage to the substrate metal surface.

What is claimed is:

1. In a method for manufacturing a photoresist stripper solution for a metal-containing substrate comprising the steps of:

a) introducing into a blending zone one or more organic sulfonic acids having the general formula:

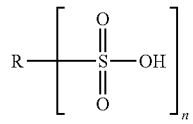

i) wherein n≥1, and R is independently an alkyl group, substituted alkyl group, aryl group, substituted aryl group, or an aryl/alkyl group;

b) uniformly blending with the one or more organic sulfonic acids at ambient temperature at least one or more halogen-free hydrocarbon solvents containing at least eight carbon atoms, wherein the one or more halogen-free hydrocarbon solvents is miscible with the one or more organic sulfonic acids;

the improvement comprising heating the blend for a minimum period of time whereby residual amounts of sulfuric acid and sulfur trioxide present in the one or more organic sulfonic acids react with the one or more hydrocarbon solvents to form corresponding organic sulfonic acids, and the resulting amounts of sulfuric acid and sulfur trioxide present in the blend after heating do not cause damage to semiconductor metal substrates.

2. The method of claim 1 wherein the blend is heated to a temperature in the range of from 45° C. to 260° C. for a time period of from 2 hours to 8 hours.

3. The method of claim 2 wherein the temperature is between 70° C. to 90° C.

4. The method of claim 1, further comprising adding a chelating agent or a corrosion inhibitor to the blend when it reaches a temperature of at least 80° C.

5. The method of claim 1 wherein the one or more organic sulfonic acids are selected from benzenesulfonic acid, $C_1$-$C_{20}$ alkylbenzenesulfonic acid, naphthalene sulfonic acid, $C_1$-$C_{20}$ alkylnaphthalene sulfonic acid, $C_7$-$C_{10}$ alkylaryl sulfonic acid, and mixtures thereof.

6. The method of claim 5, wherein $C_1$-$C_{20}$ alkylbenzenesulfonic acid comprises hexylbenzenesulfonic acid, heptylbenzenesulfonic acid, octylbenzenesulfonic acid, decylbenzenesulfonic acid, dodecylbenzenesulfonic acid, tridecylbenzenesulfonic acid, quaddecylbenzenesulfonic acid, hexadecylbenzenesulfonic acid, and mixtures thereof.

7. The method of claim 6 wherein the one or more organic sulfonic acids are selected from dodecylbenzenesulfonic acid, xylene sulfonic acid, and mixtures thereof.

8. The method of claim 7 wherein the organic sulfonic acid is dodecylbenzene sulfonic acid at a concentration of about 30% by weight, and the halogen-free hydrocarbon solvent is an aromatic hydrocarbon containing at least 8 carbon atoms at a concentration of about 70% by weight.

9. The method of claim 1, wherein the one or more halogen-free hydrocarbon solvents are selected from benzene or a benzene derivative, an aliphatic hydrocarbon containing from one to 30 carbon atoms, monoalkyl-substituted aromatic hydrocarbons, a dialkyl substituted hydrocarbon containing from 8 to 20 carbon atoms, a trialkyl-substituted aromatic hydrocarbons containing from 9 to 20 carbon atoms, and mixtures thereof.

10. The method of claim 9, wherein the one or more halogen-free hydrocarbon solvents are selected from aromatic solvents having initial boiling points of from 120° C. at 760 mm Hg pressure, and a dry point of from 170° C. to 280° C.

11. The method of claim 10, wherein the one or more aromatic solvents are present at a total concentration in the range of from 1% to 60% by weight.

12. The method of claim 9 wherein the aliphatic hydrocarbons are selected from n-pentane, n-octane, dodecane, and mixtures thereof.

13. The method of claim 9 wherein the monoalkyl-substituted aromatic hydrocarbons are selected from toluene, ethyl benzene, cumene, octylbenzene, decylbenzene, dodecylbenzene, and mixtures thereof.

14. The method of claim 9, wherein the dialkyl substituted hydrocarbons containing eight to 20 carbon atoms are selected from ortho, meta and para isomers of xylene, diethylbenzene and mixtures thereof, and the trialkyl-substituted aromatic hydrocarbons containing 9 to 20 carbon atoms are selected from 1,2,3-; 1,2,4- and 1,3,5-isomers of 10 trimethyl and triethylbenzene.

15. A method for removing a positive or negative tone photoresist, bonding adhesive, ink mark, and/or post etch residue from a semiconductor substrate comprising:
contacting the substrate with a photoresist stripper solution produced according to the method of claim 1.

16. The method of claim 15 including the additional step of rinsing the substrate with deionized water.

17. The method of claim 16, wherein the temperature is from room temperature to 150° C.

* * * * *